(12) United States Patent
Hu et al.

(10) Patent No.: US 9,570,413 B2
(45) Date of Patent: Feb. 14, 2017

(54) PACKAGES WITH SOLDER BALL REVEALED THROUGH LASER

(71) Applicant: Taiwan Semiconductor Manufacturing Company, Ltd., Hsin-Chu (TW)

(72) Inventors: Yu-Hsiang Hu, Hsin-Chu (TW); Wei-Yu Chen, Taipei (TW); Ming-Da Cheng, Jhubei (TW); Hung-Jui Kuo, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/189,701

(22) Filed: Feb. 25, 2014

(65) Prior Publication Data

US 2015/0243616 A1    Aug. 27, 2015

(51) Int. Cl.
*H01L 23/00*    (2006.01)
*H01L 21/78*    (2006.01)
(Continued)

(52) U.S. Cl.
CPC .............. *H01L 24/13* (2013.01); *H01L 21/56* (2013.01); *H01L 21/566* (2013.01); *H01L 24/11* (2013.01); *H01L 23/3114* (2013.01); *H01L 24/02* (2013.01); *H01L 24/03* (2013.01); *H01L 24/05* (2013.01); *H01L 24/16* (2013.01); *H01L 24/81* (2013.01); *H01L 24/83* (2013.01); *H01L 2224/0239* (2013.01); *H01L 2224/02313* (2013.01); *H01L 2224/02317* (2013.01); *H01L 2224/0346* (2013.01); *H01L 2224/0347* (2013.01); *H01L 2224/0401* (2013.01); *H01L 2224/05644* (2013.01); *H01L 2224/05655* (2013.01); *H01L 2224/05664* (2013.01); *H01L 2224/1146* (2013.01); *H01L 2224/11334* (2013.01); *H01L 2224/11849* (2013.01); *H01L 2224/11902* (2013.01); *H01L 2224/131* (2013.01); *H01L 2224/13022* (2013.01); *H01L 2224/13111* (2013.01); *H01L 2224/16145* (2013.01); *H01L 2224/16225* (2013.01);
(Continued)

(58) Field of Classification Search
CPC ...... H01L 23/3135; H01L 24/13; H01L 24/11; H01L 21/56; H01L 21/566; H01L 24/02; H01L 24/03; H01L 24/05; H01L 24/16; H01L 24/81; H01L 24/83
See application file for complete search history.

(56) References Cited

U.S. PATENT DOCUMENTS

2003/0218246 A1*    11/2003    Abe ................. H01L 23/50
                                              257/734
2005/0224969 A1*    10/2005    Wu .............................. 257/737
(Continued)

*Primary Examiner* — Latanya N Crawford
(74) *Attorney, Agent, or Firm* — Slater Matsil, LLP

(57) ABSTRACT

An integrated circuit structure includes a substrate, a PPI over the substrate, a solder region over and electrically coupled to a portion of the PPI, and a molding compound molding a lower portion of the solder region therein. A top surface of the molding compound is level with or lower than a maximum-diameter plane, wherein the maximum-diameter plane is parallel to a major surface of the substrate, and the maximum-diameter of the solder region is in the maximum-diameter plane.

20 Claims, 15 Drawing Sheets

(51) Int. Cl.
*H01L 21/56* (2006.01)
*H01L 23/31* (2006.01)

(52) U.S. Cl.
CPC ............. *H01L 2224/73204* (2013.01); *H01L 2224/81815* (2013.01); *H01L 2224/83104* (2013.01); *H01L 2924/014* (2013.01); *H01L 2924/12042* (2013.01); *H01L 2924/181* (2013.01)

(56) References Cited

U.S. PATENT DOCUMENTS

| | | | |
|---|---|---|---|
| 2006/0246703 A1* | 11/2006 | Daubenspeck et al. ........ | 438/612 |
| 2007/0037319 A1* | 2/2007 | Chan .................. | H01L 21/6835 |
| | | | 438/108 |
| 2008/0017984 A1* | 1/2008 | Farooq et al. ................ | 257/738 |
| 2013/0009307 A1* | 1/2013 | Lu ........................... | H01L 24/13 |
| | | | 257/738 |
| 2013/0034956 A1* | 2/2013 | Lei ........................... | H01L 24/11 |
| | | | 438/613 |
| 2013/0069225 A1* | 3/2013 | Lin et al. ..................... | 257/737 |
| 2013/0113118 A1* | 5/2013 | Kim et al. .................... | 257/782 |
| 2013/0168850 A1* | 7/2013 | Samoilov et al. ............. | 257/737 |

\* cited by examiner

PACKAGES WITH SOLDER BALL REVEALED THROUGH LASER

BACKGROUND

In the formation of wafer-level chip scale package structures, integrated circuit devices such as transistors are first formed at the surface of a semiconductor substrate in a wafer. Interconnect structures are then formed over the integrated circuit devices. A metal pad is formed over, and is electrically coupled to, the interconnect structures. A passivation layer and a first polyimide layer are formed on the metal pad, with the metal pad exposed through the openings in the passivation layer and the first polyimide.

A seed layer is then formed on the first polyimide, followed by the formation of Post-Passivation Interconnect (PPI) lines and pads. The PPI lines and pads may be formed by forming and patterning a first photo resist on the seed layer, plating the PPI lines and pads in the openings in the first photo resist, and then removing the first photo resist. The portions of the seed layer that were previously covered by the first photo resist are removed. Next, a second polyimide layer is formed over the post-passivation interconnect lines and pads, and an Under-Bump Metallurgy (UBM) is formed extending into an opening in the second polyimide layer, wherein the UBM is electrically connected to a PPI interconnect line and a pad. The formation of the UBM also involves forming a UBM seed layer, forming and patterning a second photo resist, forming the UBM on the UBM seed layer, removing the second photo resist, and removing the portions of the UBM seed layer that were previously covered by the second photo resist.

A solder Ball is then mounted on the UBM. The UBM is then molded in a molding compound by applying a liquid molding compound, and squeezing extra liquid molding compound away. The solder ball is thus partially molded in the liquid molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
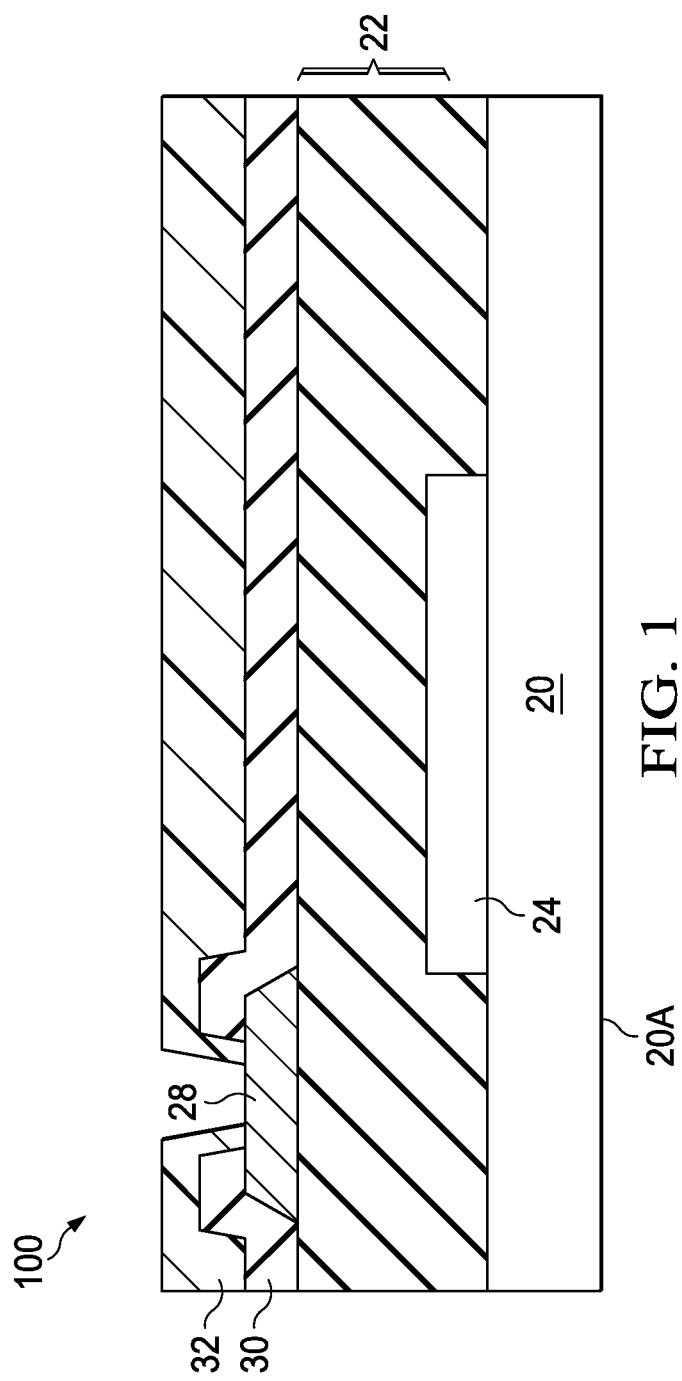
FIGS. 1 through 14 are cross-sectional views of intermediate stages in the formation of a wafer (which includes a die) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Referring to FIG. 1, wafer 100 is provided. Wafer 100 includes substrate 20, which may be a semiconductor substrate such as a silicon substrate, while it may be formed of other semiconductor materials, such as silicon germanium, silicon carbon, III-V compound semiconductor materials, or the like. Semiconductor devices 24, such as transistors, capacitors, resistors, diodes, or the like, may be formed at a surface of substrate 20. Interconnect structure 22, which includes metal lines and vias (not shown) formed therein, is formed over substrate 20, and is electrically coupled to semiconductor devices 24. The metal lines and vias may be formed of copper or copper alloys, and may be formed using damascene processes. Interconnect structure 22 may include an Inter-Layer Dielectric (ILD, not shown) and Inter-Metal Dielectrics (IMDs, not shown). In alternative embodiments, wafer 100 is an interposer wafer or a package substrate, and is substantially free from integrated circuit devices including transistors, resistors, capacitors, inductors, and/or the like, formed therein.

Metal pad 28 is formed over interconnect structure 22. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 24, for example, through the underlying interconnect structure 22. Passivation layer 30 is formed to cover edge portions of metal pad 28. In some exemplary embodiments, passivation layer 30 includes a silicon oxide layer and a silicon nitride layer over the silicon oxide layer, although other dielectric materials may be used. An opening is formed in passivation layer 30 to expose the underlying metal pad 28.

Polymer layer 32 is formed over passivation layer 30, wherein polymer layer 32 extends into the opening in passivation layer 30. Polymer layer 32 may comprise polybenzoxazole (PBO), benzocyclobutene (BCB), polyimide, or the like. Another opening is formed in polymer layer 32 to expose metal pad 28.

Figure 2:
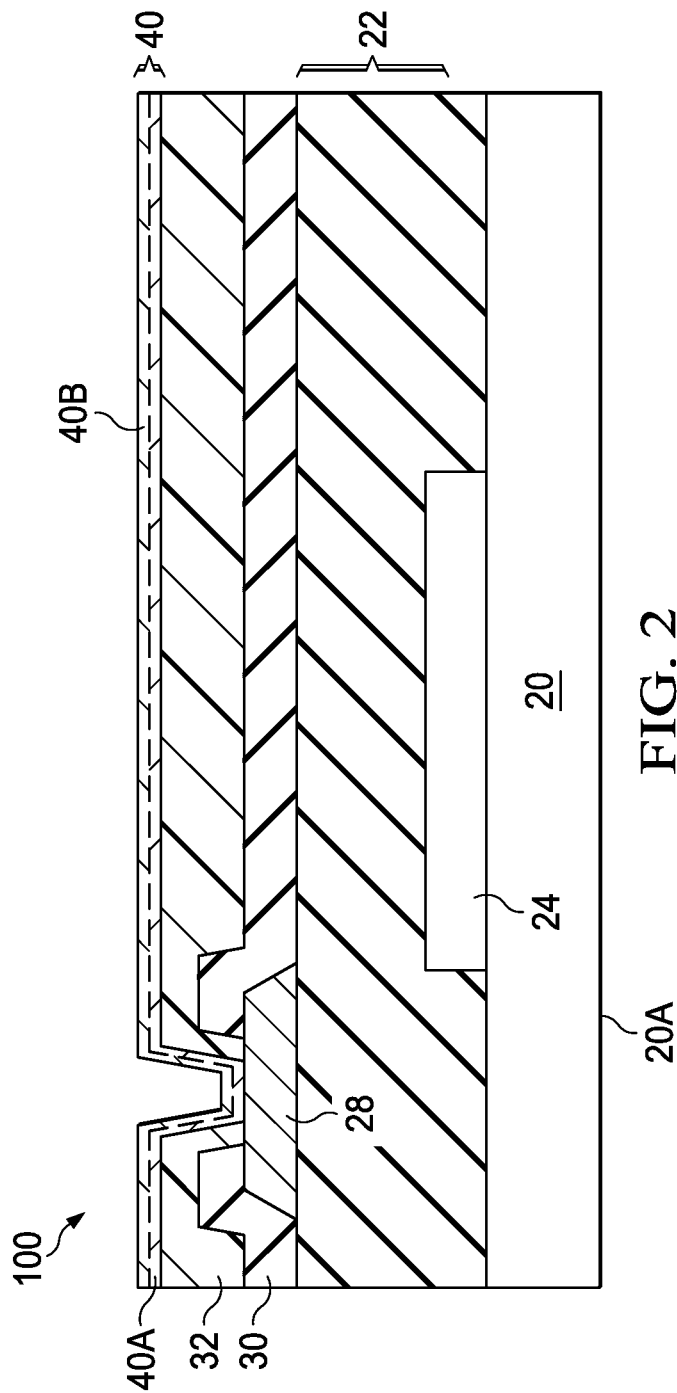

Next, as shown in FIG. 2, seed layer 40 is formed over polymer layer 32. In some embodiments, seed layer 40 includes layers 40A and 40B. Layer 40A may be a titanium layer, a titanium nitride layer, a tantalum layer, a tantalum nitride layer, or the like. The materials of layer 40B may include copper or copper alloys. In alternative embodiments, seed layer 40 is a single layer formed of, for example, copper or copper alloy. Seed layer 40 may be formed using physical vapor deposition, while other applicable methods can also be used.

Figure 3:
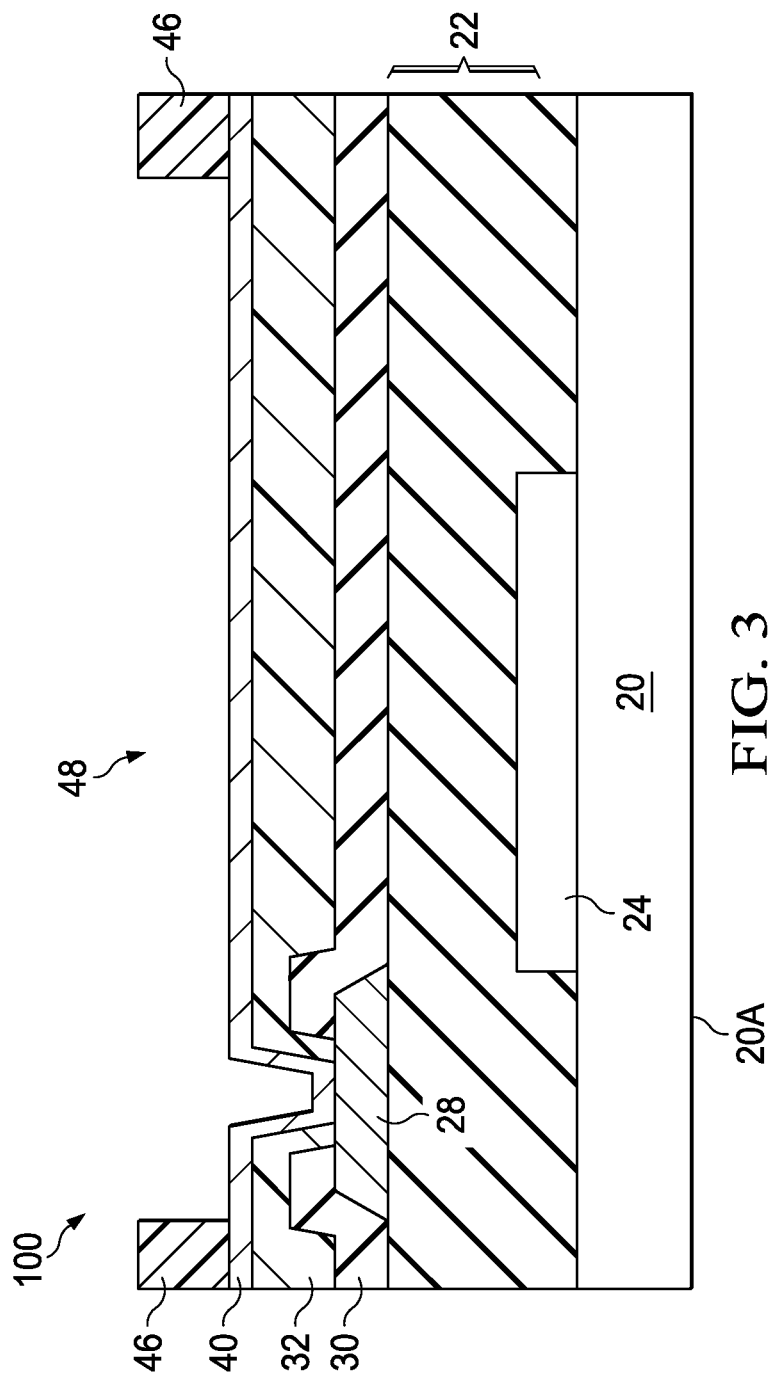
Figure 4:
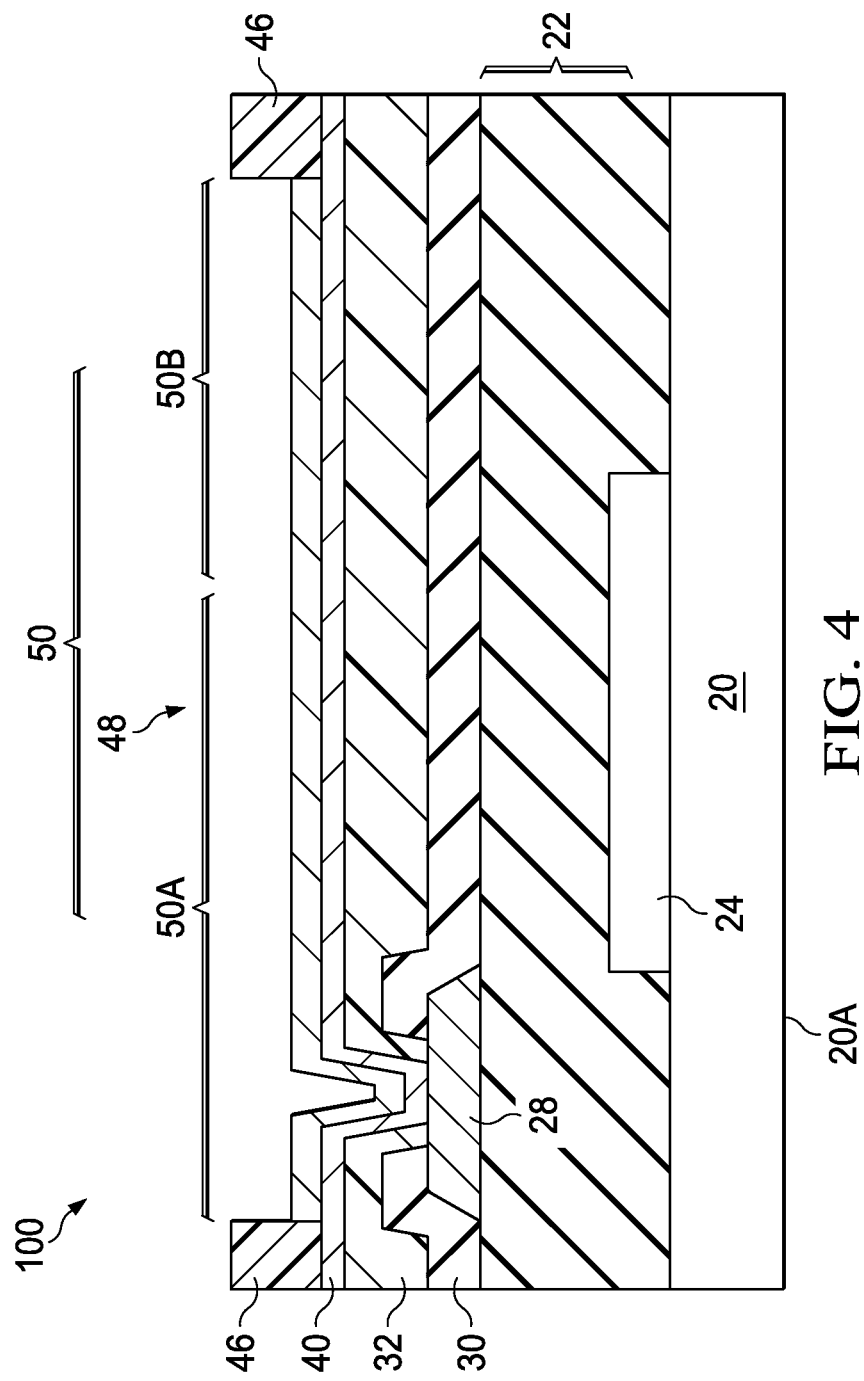

FIG. 3 illustrates the formation of mask 46. In some embodiments, mask 46 is formed of a photo resist, and hence is alternatively referred to as photo resist 46 throughout the description, although other materials such as dry film may be used. A portion of seed layer 40 is exposed through opening 48 in mask 46. Next, a plating step is performed to form Post-Passivation Interconnect (PPI) 50 in opening 48, as shown in FIG. 4. PPI 50 may be formed of copper or copper alloys, and may include PPI line 50A and PPI pad 50B, with PPI pad 50B being wider than PPI line 50A.

Figure 5:
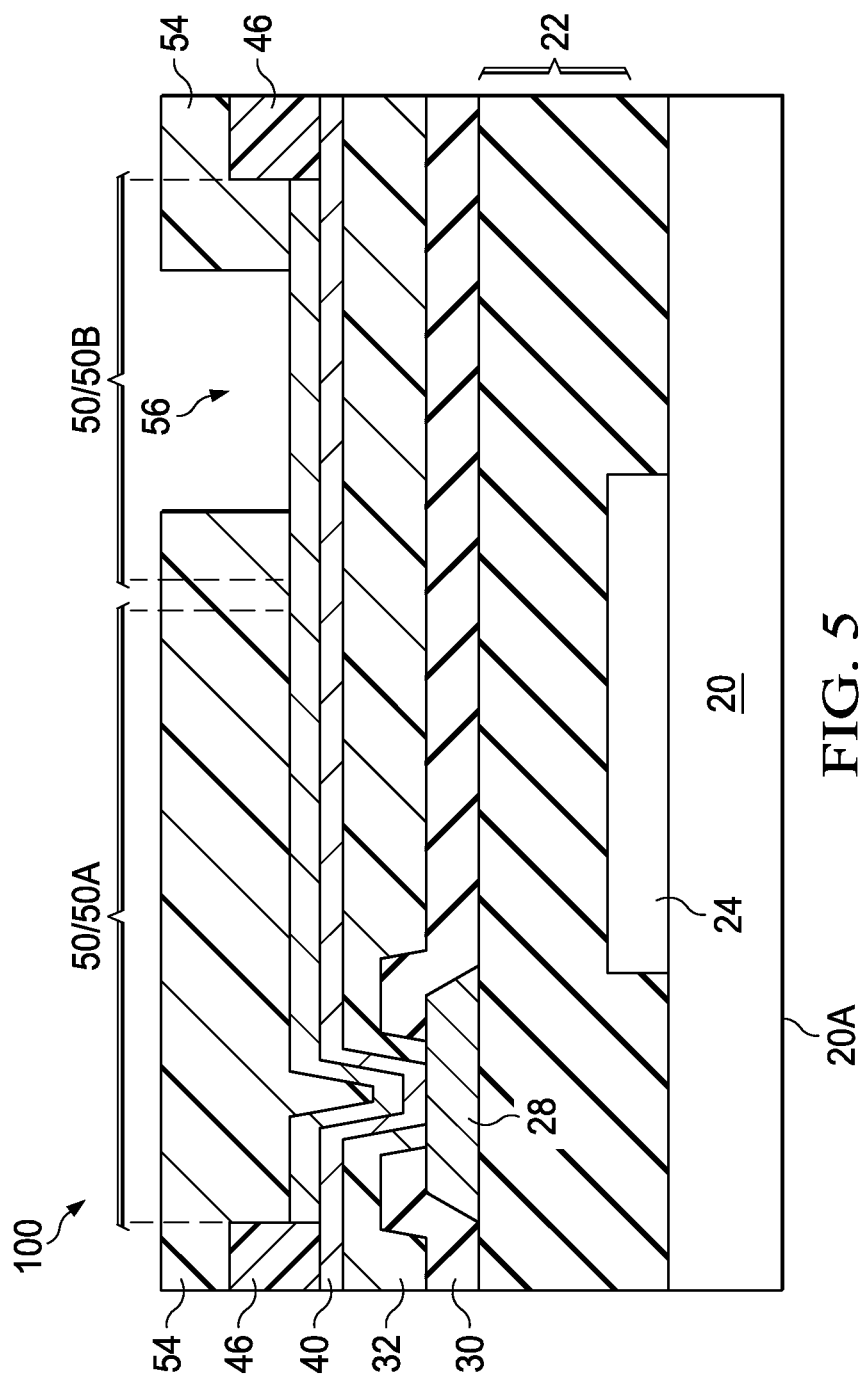

In FIG. 5, without removing photo resist 46, mask 54 is formed over photo resist 46, and is then patterned. In some embodiments, mask 54 is formed of a photo resist, and hence is referred to as photo resist 54 through the description, although mask 54 may also be formed of other materials such as a dry film. Photo resists 46 and 54 may be in physical contact with each other. Photo resists 46 and 54 may be formed of a same material or different materials. Photo resist 54 covers photo resist 46 and portions of PPI 50. At least a portion (for example, a center portion) of PPI pad 50B is exposed through opening 56 in photo resist 54.

Figure 6:
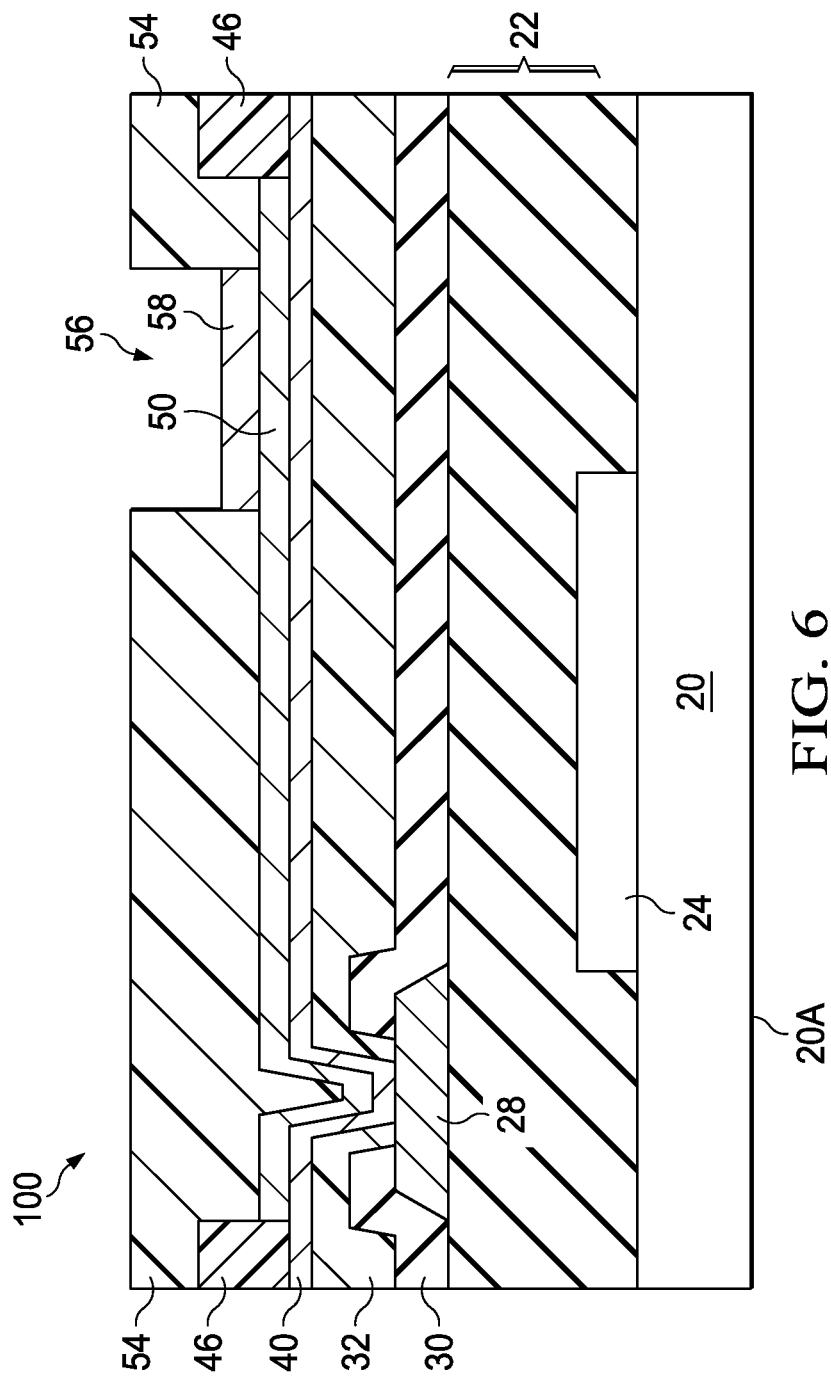

Next, as shown in FIG. 6, metal layer 58 is selectively plated onto PPI 50 and inside opening 56. Metal layer 58 may comprise a material different from the material of PPI 50. In some embodiments, metal layer 58 is a nickel-containing layer, although it may also comprise other metals such as palladium, gold, or multi-layers thereof. In some embodiments, there is no additional seed layer formed between metal layer 58 and PPI 50. For example, there is no additional titanium layer and/or copper layer between metal layer 58 and PPI 50.

Figure 7:
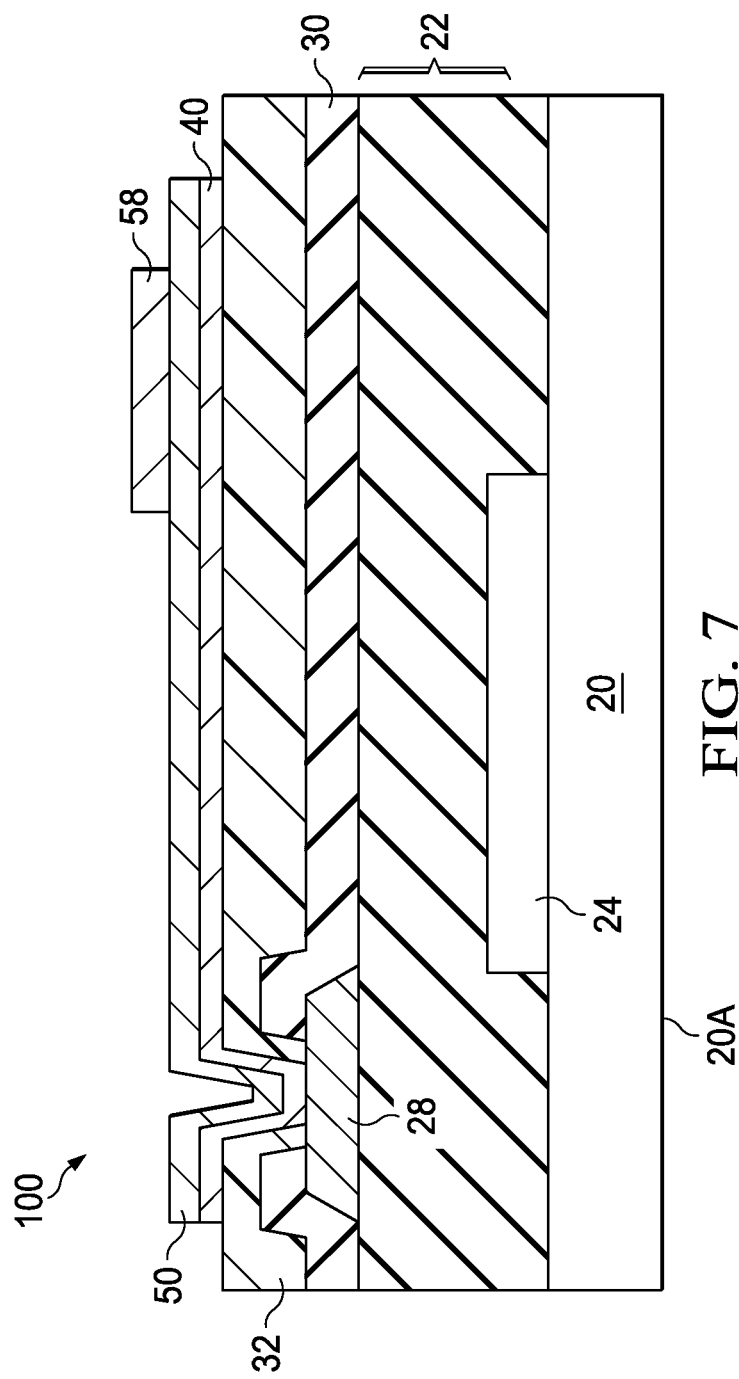

In FIG. 7, photo resists 46 and 54 as in FIG. 6 are removed. Photo resists 46 and 54 may be removed in a single photo resist stripping process, although they can also be removed separately if they are formed of different materials. Next, the exposed portions of seed layer 40 that were previously covered by photo resist 46 are removed by etching, while the portions of seed layer 40 covered by PPI 50 remain un-removed. In subsequent paragraphs, PPI 50 and the underlying seed layer 40 in combination are referred to as PPI 40/50.

Figure 8:
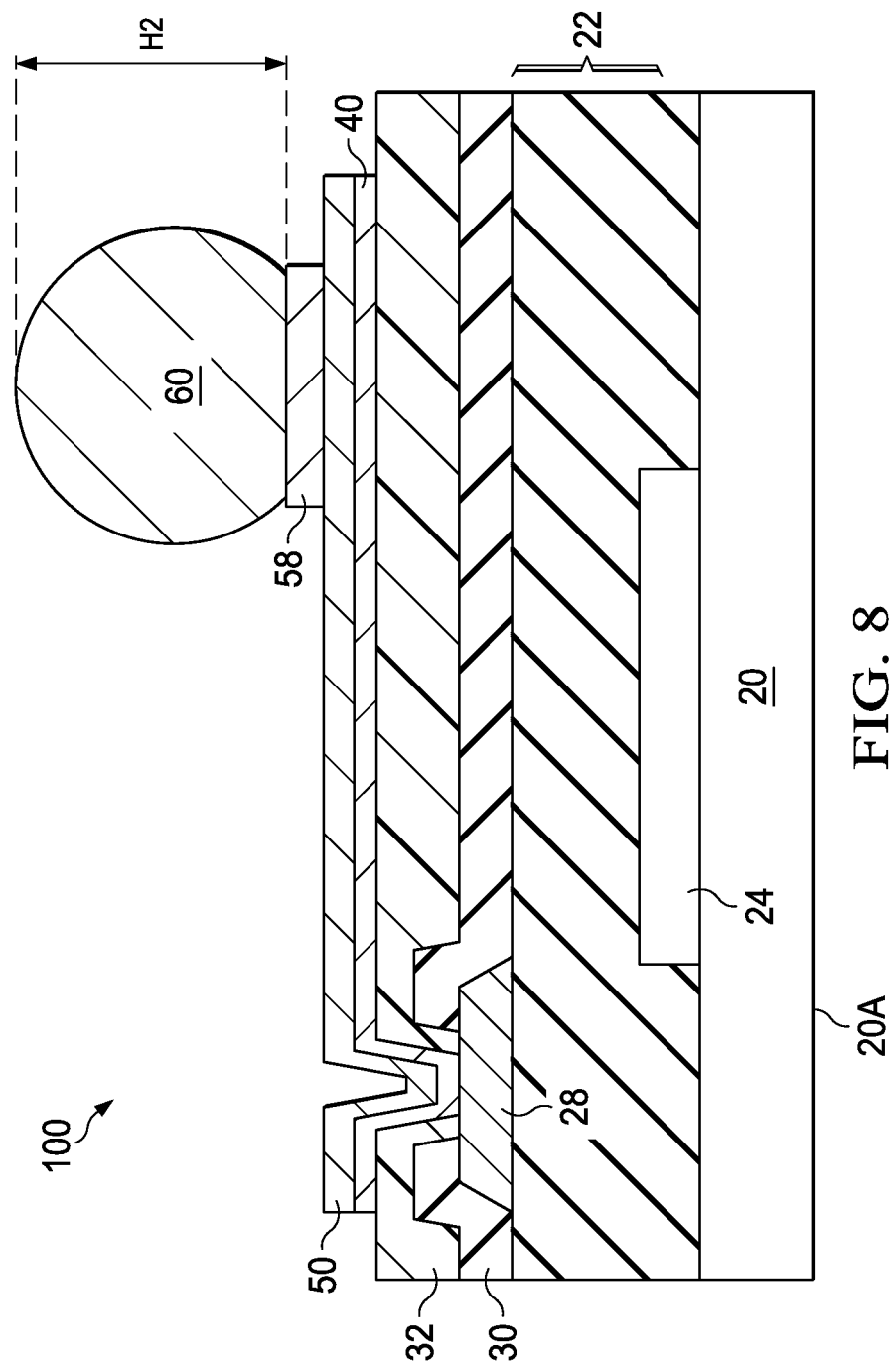

FIG. 8 illustrates the placing/mounting and the reflowing of solder ball 60 (alternatively referred to as solder bump 60 hereinafter). Solder bump 60 may be formed of a Sn—Ag alloy, a Sn—Ag—Cu alloy, or the like, and may be lead-free or lead-containing Solder bump 60 is then reflowed. After the reflow, solder bump 60 may have height H2 in the range between about 150 µm and about 300 µm. It is appreciated, however, that the values recited throughout the description are merely examples, and may be changed to different values. In alternative embodiments, solder bump 60 is formed by plating, wherein the plating of solder is performed before the removal of photo resists 46 and 54 as in FIG. 6, and after the plating of metal layer 58. A reflow is then performed to reflow the plated solder, forming solder bump 60 that has the rounded top and sidewall surfaces.

Figure 9:
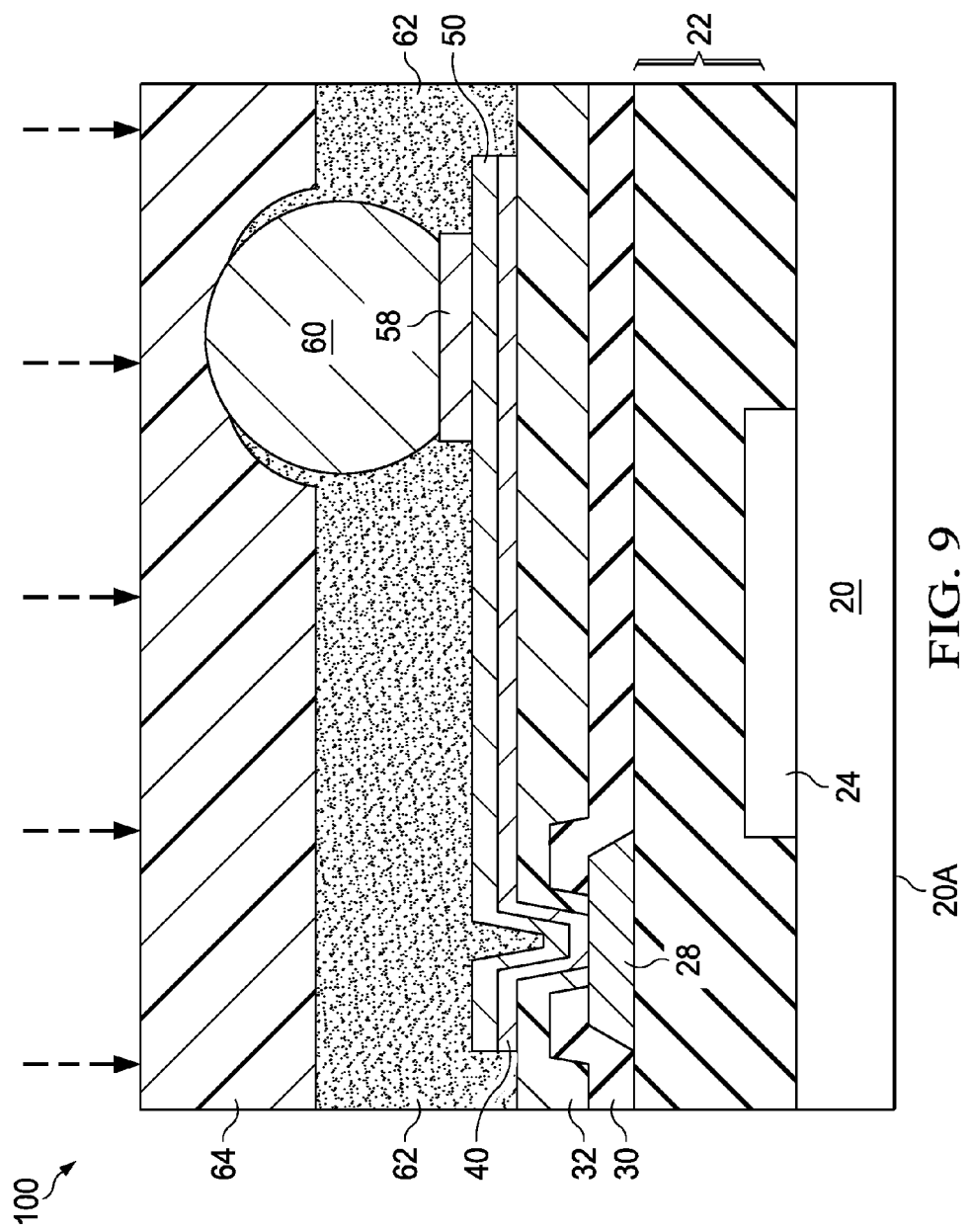

Next, as shown in FIG. 9, liquid molding compound 62 is dispensed on wafer 100, wherein at least the lower part of solder bump 60 is submerged under liquid molding compound 62. Molding compound 62 is referred to as a "liquid" molding compound due to its low viscosity, so that the excess portions of molding compound may be easily squeezed out in the subsequent step.

Next, release film 64 is applied on liquid molding compound 62. A pressure is applied, as shown by arrows. Release film 64 is formed of a soft material, so that a portion of solder bump 60 is pressed into release film 64. Furthermore, release film 64 pushes some of liquid molding compound 62 away from the top surface of wafer 100, and the bottom surface of release film 64 is lower than the top end of solder bump 60. With release film 64 remaining being pushed against solder bump 60 and liquid molding compound 62, a curing step is performed to cure and solidify liquid molding compound 62. After the solidification of molding compound 62, the top end of solder bump 60 is higher than the top surface of molding compound 62.

Figure 10:
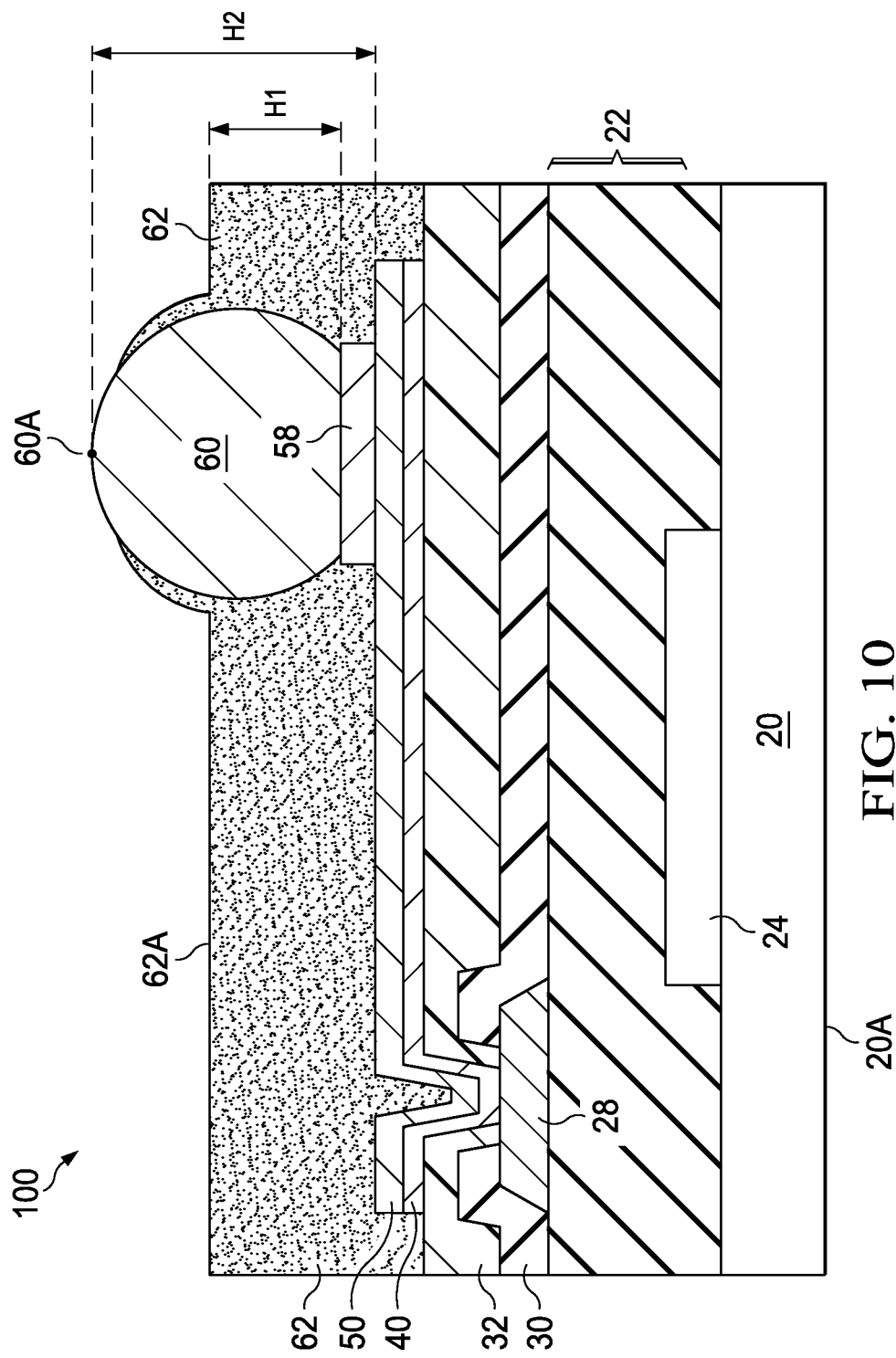

Release film 64 is then peeled off from molding compound 62, which is now in a solid form. The resulting structure is shown in FIG. 10. In the resulting structure, the lower portion of solder bump 60 is buried in molding compound 62. The top end 60A of solder bump 60 is higher than top surface 62A of molding compound 62. Furthermore, since solder bump 60 is shaped by the reflow, the top portion of solder bump 60 above molding compound 62 remains to have a rounded profile. Molding compound 62 may be in physical contact with polymer layer 32, PPI 50, and/or solder bump 60. On the other hand, there is no polymer layer over PPI 50 and/or contacting solder bump 60. In some embodiment, height H1 of solder bump 60 that is buried in molding compound 62 is more than 50 percent of the total height H2 of solder bump 60.

Figure 11:
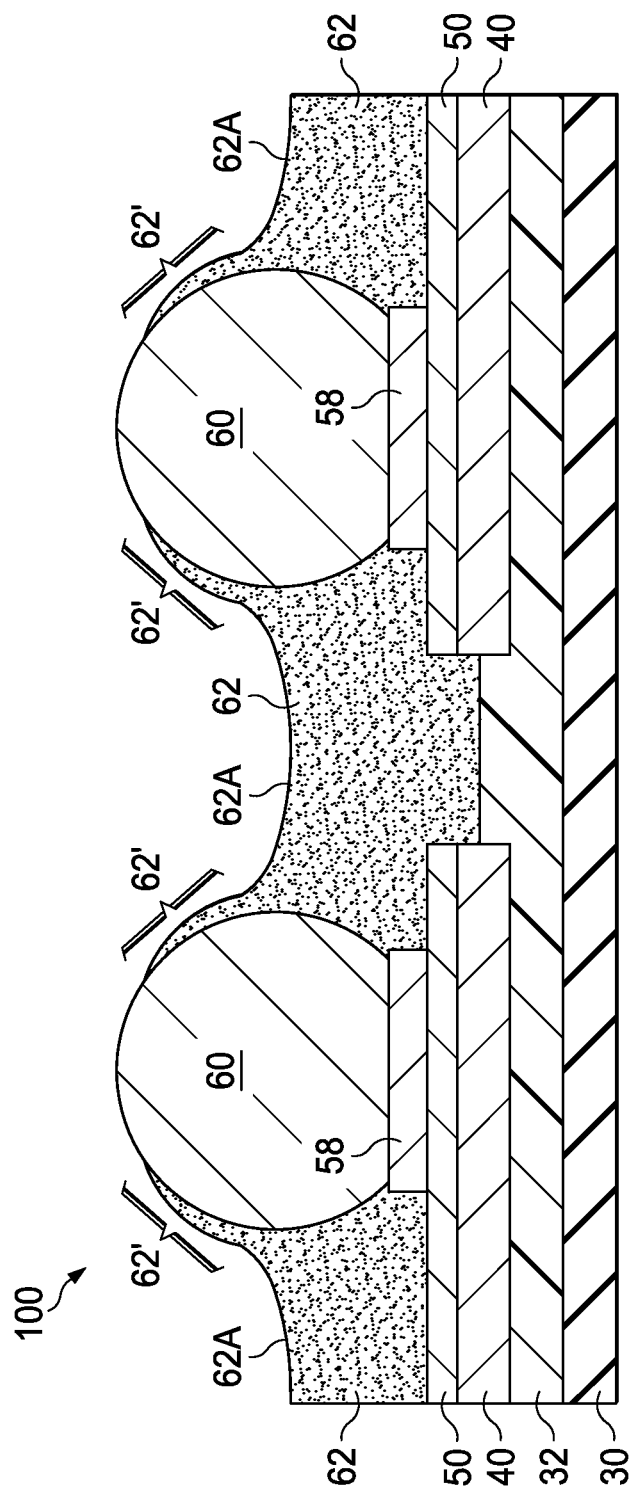

FIG. 11 illustrates a portion of wafer 100 as shown in FIG. 10, wherein two neighboring solder bumps 60 are illustrated. In addition, some details that are not shown in FIG. 10 are also illustrated. For example, FIG. 10 illustrates that the top surface 62A of molding compound 62 is rounded, wherein top surface 62A is smoothly transitioned. The rounded top surface 62A is formed due to the shape of release film 64 that is shaped when it is pushed to squeeze out liquid molding compound 62, as shown in FIG. 9. Molding compound 62 further includes residue portions 62' covering solder bump 60.

Figure 12:
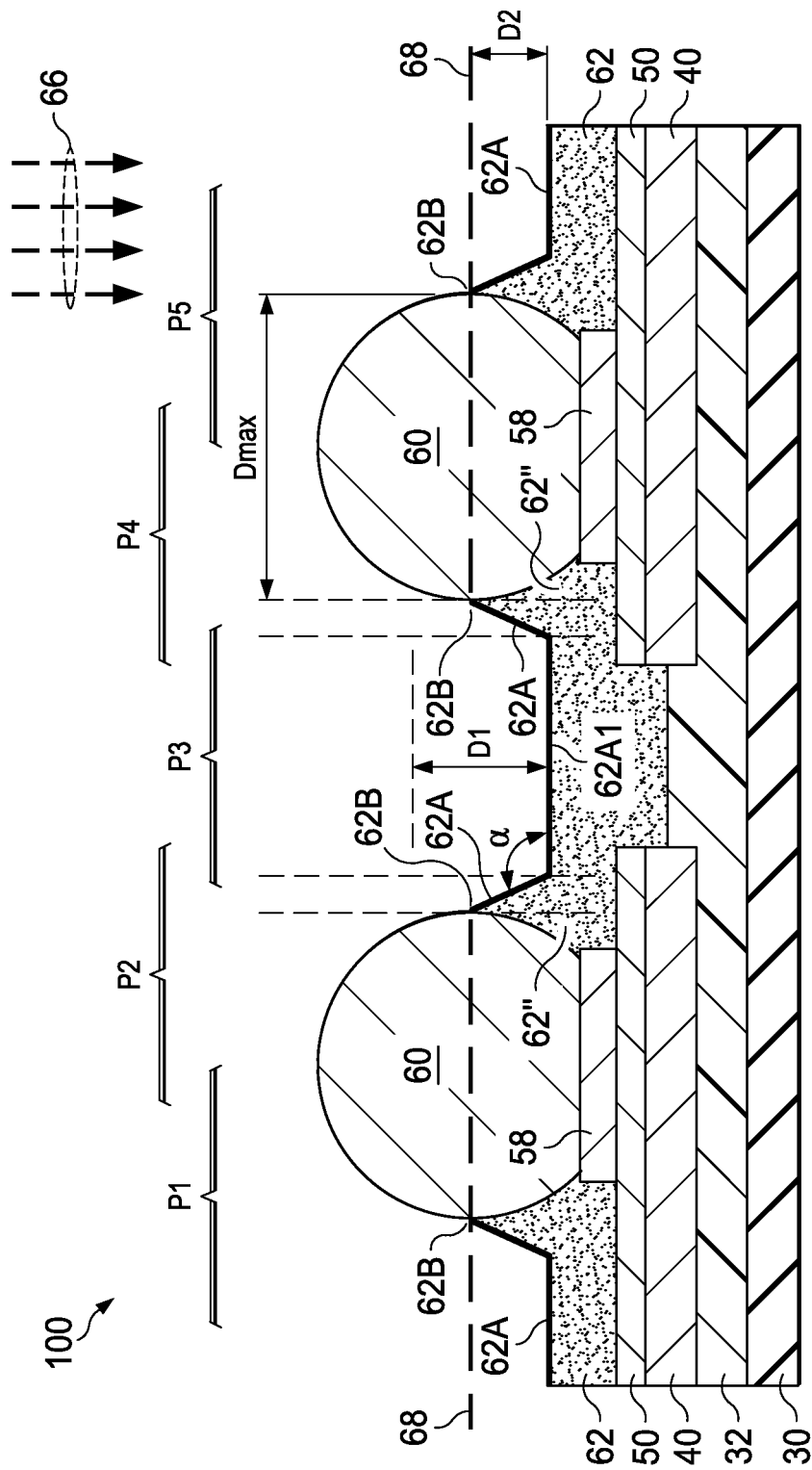

FIG. 12 illustrates the laser etch of molding compound 62. The laser etch has the function of removing residue portions 62' in FIG. 11. In addition, the laser etch has the function of removing a top surface layer of molding compound 62, so that more surfaces of solder bumps 60 are exposed. The increase in the size of exposed surface of solder bump 60 may improve the bonding of the resulting dies to other package components such as dies, interposers, package substrate, and Printed Circuit Boards (PCBs).

The laser etch is performed using laser beam 66. The exemplary power of laser beam 66 may be in the range between about 3 Watt and about 6 Watts, for example, which range of power may result in the laser etch depth D1 to be between, for example, about 10 µm and about 55 µm. Furthermore, besides the laser power, the laser etch depth D1 is affected by other factors such as the size of the laser beam, the composition of molding compound 62, or the like. When the laser etch depth D1 is desired to be greater or smaller, the laser power may be increased or reduced.

Laser etch depth D1 is the recessing depth of molding compound 62 measured at a middle position between two neighboring solder bumps 60. In some embodiments, laser etch depth D1 is greater than about 1 µm, 2 µm, 5 µm, or more, and may be in the range between about 10 µm and about 100 µm. It is appreciated that achieving such laser etching depth D1 requires a much higher laser power than the laser power required for removing residue portion 62' in FIG. 10. During the laser etch, laser beam 66 scans the respective wafer 100. For example, FIG. 12 illustrates laser scan paths P1, P2, P3, P4, and P5, wherein laser beam 66 travels through laser scan paths one by one. The laser paths may overlap slightly with each other to ensure the full coverage of wafer 100 by laser beam 66.

In some embodiments, solder bump 60 has a rounded top surface and rounded sidewalls as a result of the reflow. From the top end to the bottom surface of solder bump 60, the diameters of solder bump 60 gradually increase until they reach a maximum diameter Dmax, and then the diameters gradually decrease. The diameters of solder bump 60 (including the maximum diameter Dmax) are measured in horizontal planes that are parallel to the major top surface and bottom surface (for example, bottom surface 20A of substrate 20 (FIG. 1)) of wafer 100. Throughout the description, horizontal plane 68, in which the maximum diameter Dmax is measured, is referred to as a max-diameter plane. In some embodiments, after the laser etch, the portions of molding compound 62 over the max-diameter plane 68 are removed. Hence, the top ends 62B of molding compound 62 may be level with or lower than the max-diameter plane 68. Top ends 62B may also be the joining point of the top surface of molding compound 62 and solder bump 60.

Since laser beam 66 is projected down from above, solder bump 60 forms a shadow for laser beam 66, and solder bump 60 protects the portions 62" of molding compound 62 from being removed since portions 62" are in the shadow of solder bump 60. In addition, in the middle between two neighboring solder bumps 60, the top surface of molding compound 62 is lower than the max-diameter plane 68, for example, by a difference D2 greater than about 30 μm.

The portion of molding compound 62 between two neighboring solder bumps 60 may have a U-shaped top surface in the cross-sectional view, as shown in FIG. 12. During the laser etch, the portion in the middle is recessed more than the portions that are close to solder bumps 60, and eventually, the U-shape is formed. The U-shape includes bottom side 62A1, which is parallel to a major surface 20A (FIG. 1) of substrate 20, and two slant sides 62A2 connected to bottom side 62A1. Bottom side 62A1 and slant sides 62A2 may be substantially straight. The bottom side 62A1 and slant sides 62A2 form distinguishable angles α that are greater than 90 degrees. For example, angle α may be in the range between about 110 degrees and about 160 degrees. Angle α may also be between about 120 degrees and about 150 degrees.

The laser etch results in the roughness of the top surface 62A of molding compound 62 to be increased. For example, before the laser etch (FIG. 10), the surface roughness Ra of top surface 62A of molding compound 62 is 1.5 μm or lower. The surface roughness Ra is measured in areas that have sizes smaller than about 500 μm×500 μm, for example. After the laser etch, the surface roughness Ra of top surface 62A (62A1 or 62A2) of molding compound 62 (FIG. 12) is increased to higher than about 2 μm. The surface roughness Ra may be between about 2.0 μm and about 5.0 μm.

Figure 13:
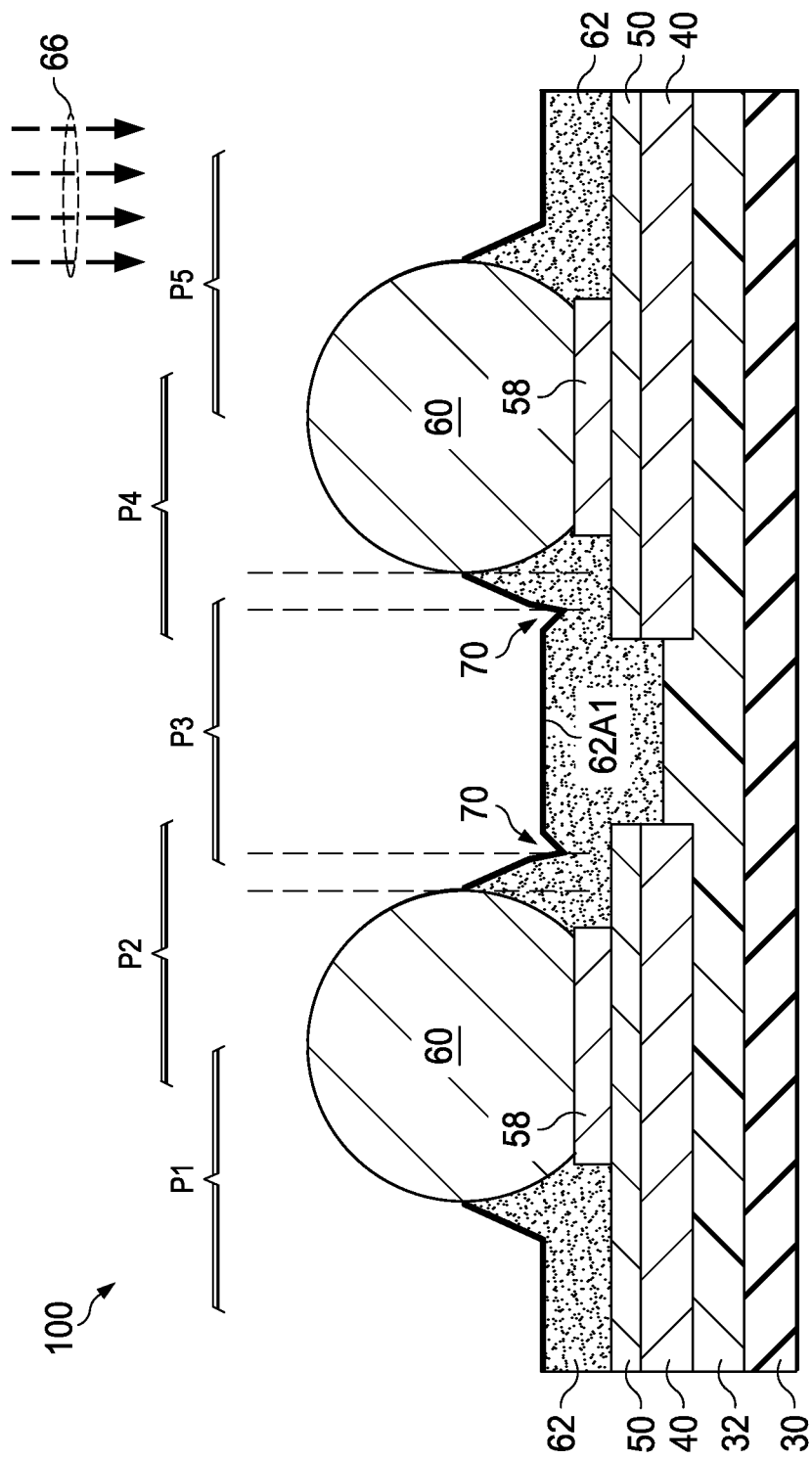
Figure 14:
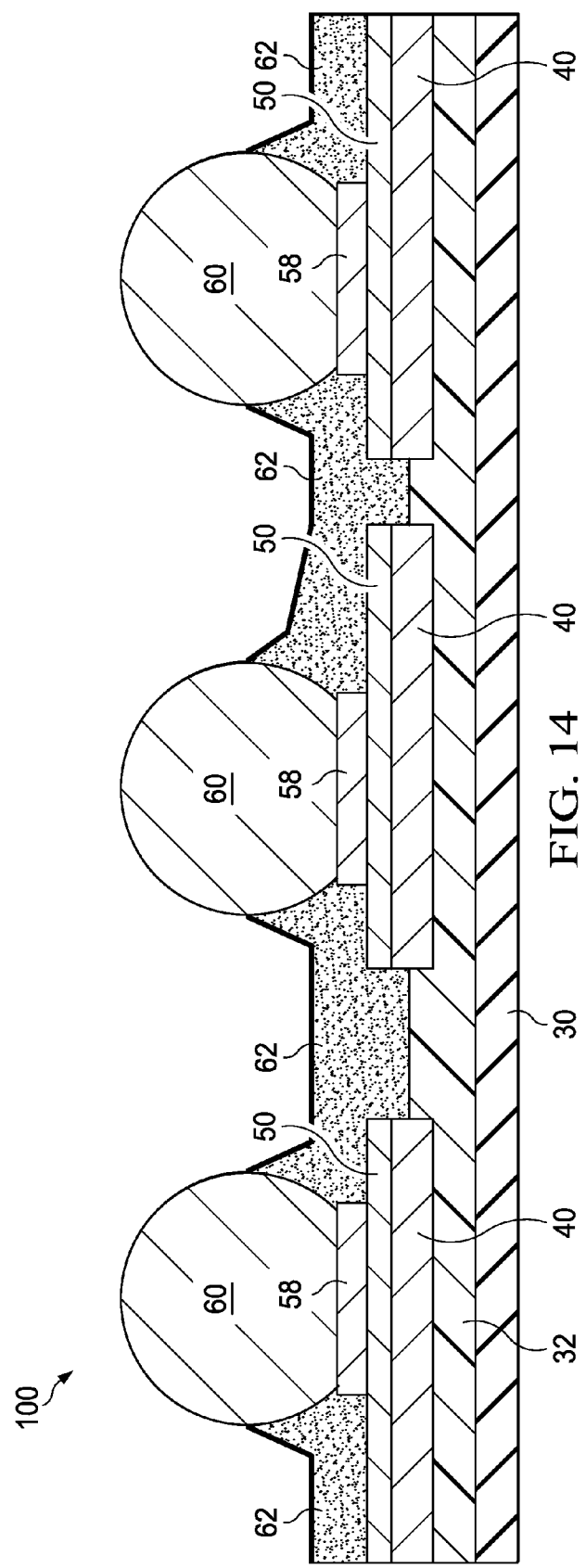

Depending on various conditions such as where the laser paths (such as P1, P2, P3, P4, and P5) meet, the top surfaces of molding compound 62 may have different cross-sectional view shapes in different locations of wafer 100. For example, as shown in FIG. 13, if the overlap region of two laser paths (for example, P2 and P3) overlap the corner regions of the U-shape, then these portions of molding compound 62 may form divots 70. FIG. 14 illustrates another likely profile of the top surface of molding compound 62, wherein the U-shape is twisted, with one end of the bottom side of the U-shape significantly higher than the other end.

Figure 15:
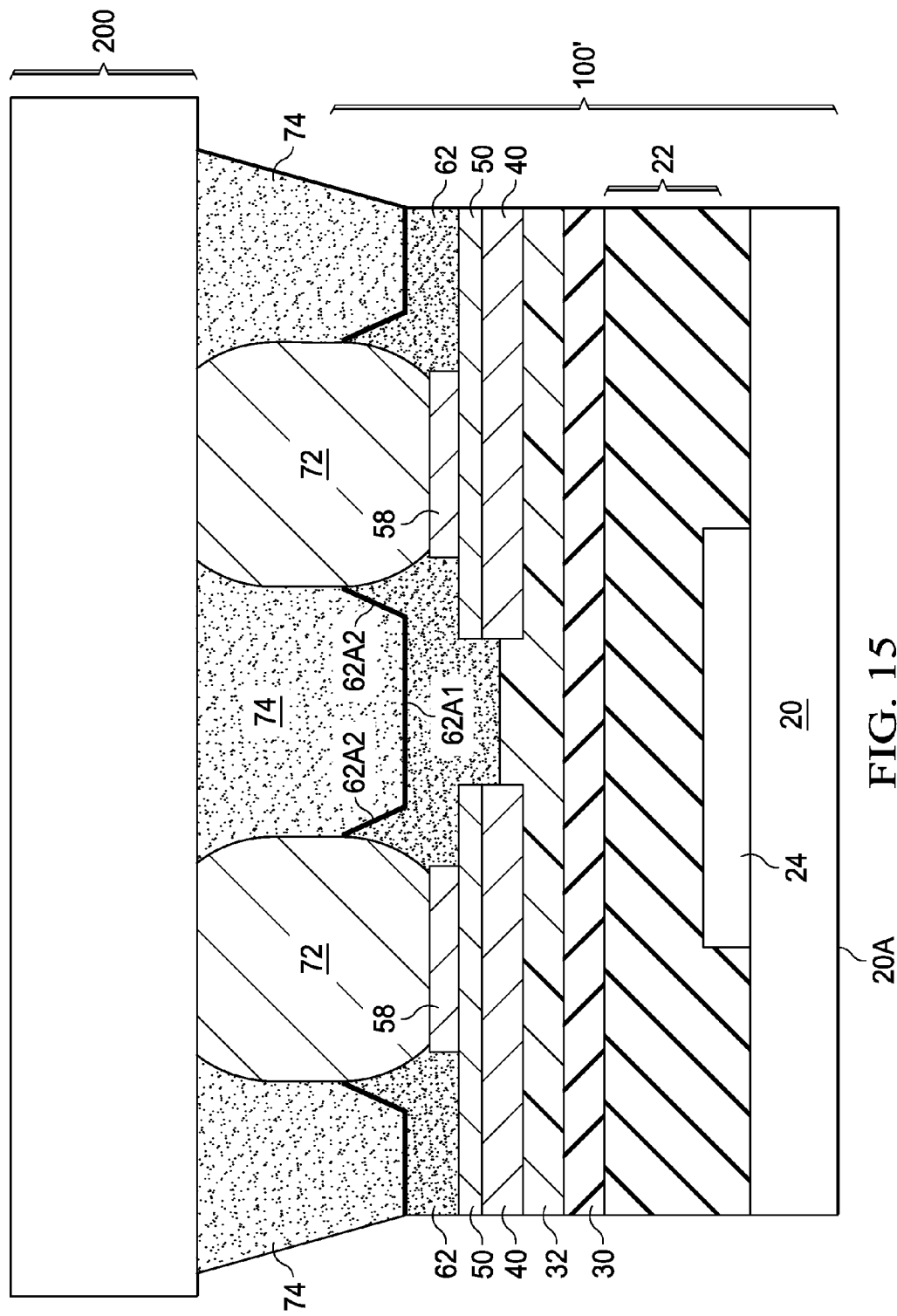
FIG. 15 illustrates the bonding of a die to a package component in accordance with some embodiments.

After the laser etch, wafer 100 as shown in FIGS. 11 through 14 is sawed into dies. In FIG. 15, the respective die 100' is bonded to another package component 200, which may be another device die, an interposer, a package substrate, a PCB, or the like. Solder bump 60 in FIGS. 11 through 14 is reflowed to form solder region 72 in FIG. 15, wherein solder region 72 joins die 100' to package component 200. Underfill 74 may be filled into the U-shaped recess, wherein underfill 74 is in contact with solder region 72 and molding compound 62.

The embodiments of the present disclosure have some advantageous features. By using laser etch to etch the molding compound, the residue molding compound on solder bumps are removed. Furthermore, the top surface of the molding compound is recessed to expose more of the surfaces of the solder bumps. The bonding of the resulting die to other package components is thus more reliable.

In accordance with some embodiments of the present disclosure, an integrated circuit structure includes a substrate, a PPI over the substrate, a solder region over and electrically coupled to a portion of the PPI, and a molding compound molding a lower portion of the solder region therein. A top surface of the molding compound is level with or lower than a maximum-diameter plane, wherein the maximum-diameter plane is parallel to a major surface of the substrate, and the maximum-diameter of the solder region is in the maximum-diameter plane.

In accordance with alternative embodiments of the present disclosure, an integrated circuit structure includes a substrate, a metal pad over the substrate, a passivation layer including a portion over the metal pad, a polymer layer over the passivation layer, and a PPI including a portion over the polymer layer. The PPI is electrically coupled to the metal pad. A first solder region is over and electrically coupled to a portion of the PPI. A second solder region is adjacent to the first solder region. A molding compound is between the first solder region and the second solder region, wherein a top surface of the molding compound has a U-shape. The U-shape has a bottom side, and a first slant side and a second slant side connected to the bottom side.

In accordance with yet alternative embodiments of the present disclosure, a method includes performing a reflow to form a solder bump at a surface of a wafer. The wafer includes a substrate, a metal pad over the substrate, a passivation layer comprising a portion over the metal pad, a polymer layer over the passivation layer, and a PPI comprising a portion over the polymer layer. The PPI is electrically coupled to the metal pad. The solder bump is over and electrically coupled to the PPI. The method further includes dispensing a molding compound, wherein at least a lower part of the solder bump is molded in the molding compound, and performing a laser etch on the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a reflow to form a solder bump at a surface of a wafer, wherein the wafer comprises:
a substrate;
a metal pad over the substrate;
a passivation layer comprising a portion over the metal pad;
a polymer layer over the passivation layer; and
a Post-Passivation Interconnect (PPI) comprising a portion over the polymer layer, wherein the PPI is electrically coupled to the metal pad, wherein the solder bump is over and electrically coupled to the PPI;
dispensing a molding compound, wherein at least a lower part of the solder bump is molded in the molding compound;
pushing away excess portions of the molding compound using a release film, wherein the excess portions comprise a portion over the solder bump;
peeling off the release film from the molding compound and the solder bump; and
after the excess portions of the molding compound are pushed away, performing a laser etch on the molding compound, wherein after the laser etch, the top end of the molding compound is lowered to a level below a maximum-diameter plane, wherein the maximum-diameter plane is parallel to a major surface of the substrate, and wherein a maximum-diameter of the solder bump is in the maximum-diameter plane.

2. The method of claim 1, wherein after the laser etch, a top surface of the molding compound forms a U-shape, with the U-shape comprising:
a bottom side;
a first slant side and a second slant side connected to the bottom side; and
a first and a second divots extending from the bottom side down into the molding compound, wherein the first and the second divots are located where the bottom side joins the first slant side and a second slant side, respectively.

3. The method of claim 2, wherein after the laser etch, a top end of the first slant side is close to a maximum-diameter plane.

4. The method of claim 1 further comprising forming a metal layer over and contacting the PPI, wherein the metal layer is underlying and contacting the solder bump, and wherein the forming the metal layer and the forming the PPI comprise:
forming a seed layer having a first portion over the polymer layer, and a second portion extending into an opening in the polymer layer to contact the metal pad;
forming a first mask over the seed layer;
performing a first plating process to form the PPI in an opening of the first mask;
forming a second mask covering the first mask and a line portion of the PPI, with a pad portion of the PPI exposed through an opening in the second mask;
performing a second plating process to form the metal layer; and
after the second plating process, removing both the first mask and the second mask.

5. The method of claim 4 further comprising removing the first mask and the second mask in a single striping process.

6. The method of claim 1, wherein in the laser etch, the solder bump receives a laser beam used for the laser etch.

7. The method of claim 6, wherein in the laser etch, the laser beam substantially fully covers the wafer.

8. The method of claim 1, wherein in the laser etch, a laser beam is projected on the wafer with a plurality of paths, and neighboring ones of the plurality of paths are overlapped partially.

9. The method of claim 8, wherein the molding compound comprises a first portion and a second portion, and the second portion received more laser beam passing than the first portion.

10. A method comprising:
performing a reflow to form a solder bump at a surface of a wafer;
dispensing a molding compound, wherein at least a lower part of the solder bump is molded in the molding compound;
pushing away excess portions of the molding compound using a release film, wherein the excess portions comprise a portion over the solder bump;
peeling off the release film from the molding compound and the solder bump; and
after the excess portions of the molding compound are pushed away, performing a laser etch on the molding compound using a laser beam, wherein the laser beam is projected on both the solder bump and the molding compound, and after the laser etch, a top surface of the molding compound forms a U-shape, with the U-shape comprising:
a bottom side; and
a first slant side and a second slant side connected to the bottom side.

11. The method of claim 10, wherein after the laser etch, the top end of the molding compound is lowered to a level below a maximum-diameter plane, wherein the maximum-diameter plane is parallel to a major surface of the wafer, and wherein a maximum-diameter of the solder bump is in the maximum-diameter plane.

12. The method of claim 10, wherein after the laser etch, a top end of the first slant side is substantially in a maximum-diameter plane, wherein the maximum-diameter plane is parallel to a major surface of the wafer, and wherein a maximum-diameter of the solder bump is in the maximum-diameter plane.

13. The method of claim 10 further comprising forming a metal layer over and contacting the PPI, wherein the metal layer is underlying and contacting the solder bump, and wherein the forming the metal layer and the forming the PPI comprise:
forming a seed layer;
forming a first mask over the seed layer;
performing a first plating process to form the PPI in an opening of the first mask;
forming a second mask covering the first mask and a line portion of the PPI, with a pad portion of the PPI exposed through an opening in the second mask;
performing a second plating process to form the metal layer; and
after the second plating process, removing both the first mask and the second mask.

14. The method of claim 13 further comprising removing the first mask and the second mask in a single striping process.

15. The method of claim 10, wherein in the laser etch, the laser beam substantially fully covers the wafer.

16. A method comprising:
performing a reflow to form a solder bump at a surface of a wafer, wherein the wafer comprises:

a polymer layer; and a Post-Passivation Interconnect (PPI) comprising a portion over the polymer layer, wherein the solder bump is over and electrically coupled to the PPI;

dispensing a molding compound, wherein at least a lower part of the solder bump is molded in the molding compound;

squeezing out excess portions of the molding compound using a release film until the release film contacts the solder bump;

removing the release film to expose the solder bump; and performing a laser etch on the molding compound using a laser beam, wherein the laser beam is scanned through the wafer, wherein after the laser etch, a top surface of the molding compound forms a U-shape, with the U-shape comprising:

a bottom side;

a first slant side and a second slant side connected to the bottom side; and a first and a second additional recess extending from the bottom side down into the molding compound, wherein the first and the second additional recesses are at where the bottom side joins the first slant side and a second slant side, respectively.

17. The method of claim 16, wherein after the laser etch, the top end of the molding compound is lowered to a level below a maximum-diameter plane, wherein the maximum-diameter plane is parallel to a major surface of the wafer, and wherein a maximum-diameter of the solder bump is in the maximum-diameter plane.

18. The method of claim 16, wherein neighboring paths of the laser beam are overlapped partially.

19. The method of claim 18, wherein the molding compound comprises a first portion and a second portion, and the second portion received more laser beam passing than the first portion.

20. The method of claim 16, wherein the laser beam is projected on the wafer with a plurality of paths, and neighboring ones of the plurality of paths are overlapped partially, and first and the second additional recesses are generated by overlapped portions of the plurality of paths.

* * * * *